(12) United States Patent
Huang et al.

(10) Patent No.: US 9,591,780 B2
(45) Date of Patent: Mar. 7, 2017

(54) COMPLIABLE UNITS AND COMPLIABLE NETWORK HAVING THE SAME

(71) Applicant: IMEC Taiwan Co., Hsinchu (TW)

(72) Inventors: Kevin Huang, Taipei (TW); Chihchung (Gary) Chen, Zhubei (TW)

(73) Assignee: IMEC Taiwan Co., Hsinchu (TW)

( * ) Notice: Subject to any disclaimer, the term of this patent is extended or adjusted under 35 U.S.C. 154(b) by 643 days.

(21) Appl. No.: 13/763,010

(22) Filed: Feb. 8, 2013

(65) Prior Publication Data

US 2014/0043775 A1 Feb. 13, 2014

Related U.S. Application Data

(60) Provisional application No. 61/681,176, filed on Aug. 9, 2012.

(51) Int. Cl.
| | |
|---|---|
| *H05K 1/00* | (2006.01) |
| *H05K 1/18* | (2006.01) |
| *H05K 7/00* | (2006.01) |
| *H05K 7/02* | (2006.01) |
| *H01L 23/538* | (2006.01) |

(52) U.S. Cl.
CPC ........... *H05K 7/02* (2013.01); *H01L 23/5386* (2013.01); *H01L 2924/0002* (2013.01)

(58) Field of Classification Search
USPC ........... 361/748; 174/251, 260; 257/414–417
See application file for complete search history.

(56) References Cited

U.S. PATENT DOCUMENTS

| 8,045,280 B2 * | 10/2011 | Henriksen et al. ........... 359/811 |
| 8,786,033 B2 * | 7/2014 | Saito .................... A61B 5/1172 |
| | | 257/124 |
| 2008/0186837 A1 * | 8/2008 | Hong et al. ................. 369/272.1 |
| 2011/0194326 A1 * | 8/2011 | Nakanishi et al. ............. 365/51 |
| 2013/0095349 A1 * | 4/2013 | Van Dorn et al. ............ 428/800 |

* cited by examiner

*Primary Examiner* — Andargie M Aychillhum
(74) *Attorney, Agent, or Firm* — McDonnell Boehnen Hulbert & Berghoff LLP

(57) ABSTRACT

A compliable unit in an compliable network comprises a first layer including at least one device component at a first region of the first layer, and a second layer including at least one compliable element at a first region of the second layer to transfer the at least one device component to a desired location. The first layer and the second layer are arranged in a stack.

30 Claims, 24 Drawing Sheets

COMPLIABLE UNITS AND COMPLIABLE NETWORK HAVING THE SAME

CROSS REFERENCE TO RELATED APPLICATION

The present application claims the benefit of priority of U.S. Provisional Patent Application Ser. No. 61/681,176 filed 9 Aug. 2012.

TECHNICAL FIELD

The present disclosure generally relates to compliable structures and, more particularly, to structures of compliable units and compliable networks comprising the compliable units.

RELATED ART

Recently, compliable structures have been developed and used in various wired and wireless electrical networks to address issues with such networks due to, for example, inflexibility in circuit connection and susceptibility to damage. A compliable structure may enjoy several benefits from its low-stress electronic solution, 2D-conformal properties, semi-transparency, batch-type processing ability, and the manufacturing compatibility as an integrated device. In some systems, the compliable structures include a device layer with device components, and a compliable structure layer with spring elements or compliable elements. However, the device layer and the compliable structure layer are provided on a same side of a substrate or carrier. Accordingly, some of the compliable structures may suffer low wafer throughput, limited process integration, limited material selection, footprint restriction for expanding distance, and/or non-replaceable defects.

It may therefore be desirable to provide a compliable unit/network that is able to address the issues of the known compliable structures.

SUMMARY

Examples of the present disclosure provide a compliable unit in a compliable network that includes a first layer having at least one device component at a first region of the first layer, and a second layer having at least one compliable element at a first region of the second layer to transfer the at least one device component to a desired location, wherein the first layer and the second layer are arranged in a stack.

In one embodiment, the compliable unit may further include at least one device component at a second region of the second layer.

In another embodiment, the compliable unit may further include at least one compliable element at a second region of the first layer.

In yet another embodiment, the compliable unit may further include a third layer stacked over at least one of the first layer or the second layer.

Some examples of the present disclosure provide a compliable network including a plurality of compliable units. The compliable network may have a first layer including a plurality of device components at a first region of the first layer, and a second layer including a plurality of compliable elements at a first region of the second layer to transfer the device components to a desired location, wherein the first layer and the second layer are arranged in a stack.

In one embodiment, the compliable network may further include a plurality of device components at a second region of the second layer.

In another embodiment, the compliable network may further include a plurality of compliable elements at a second region of the first layer.

In yet another embodiment, the compliable network may further include a third layer stacked over at least one of the first layer or the second layer.

Moreover, in the compliable network, at least one of the compliable units may serve as a grabbing pad.

BRIEF DESCRIPTION OF THE DRAWINGS

Various aspects of the present disclosure will become apparent upon reading the following description and upon reference to the accompanying drawings in which.

DESCRIPTION OF THE EMBODIMENTS

Figure 1A:
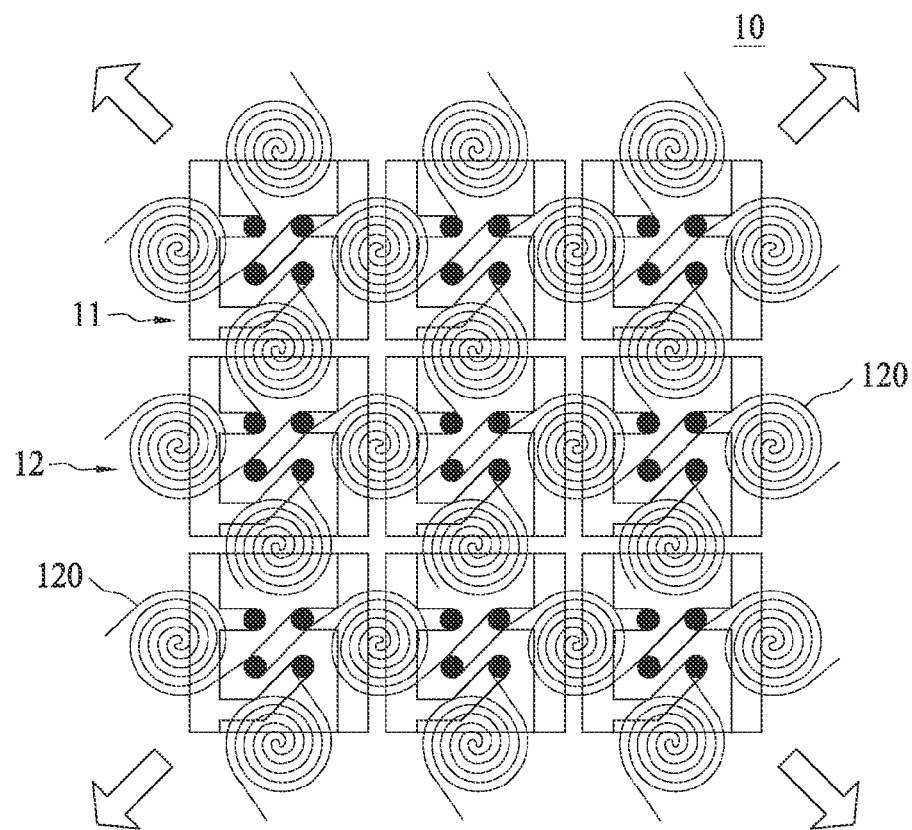
FIG. 1A is a schematic top view of a compliable network according to an embodiment.

FIG. 1A is a schematic top view of a compliable network 10 according to an embodiment of the present disclosure. Referring to FIG. 1A, the compliable network 10 may include a multi-layer structure further including a device layer 11, which may serve as a first layer, and a compliable structure layer 12, which may serve as a second layer. The device layer 11, stacked on the compliable structure layer 12, may include a plurality of device components (not shown) to provide one or more desired functions. The compliable structure layer 12 may include a plurality of compliable elements 120 to transfer the plurality of device components to a desired location, site or space.

In one embodiment, the compliable structure layer 12 may be stretched to transfer the device layer 11 at a first site that occupies a first area to a second site that occupies a second area greater than the first area. The first site and the second site may refer to the minimum region to bound the device components before and after the expansion of the compliable network 10, respectively.

In another embodiment, the compliable structure layer 12 may be compressed to transfer the device layer 11 at the second site to the first site.

In still another embodiment, a first portion of the compliable structure layer 12 may be stretched while a second portion of the compliable structure layer 12 may be compressed.

Figure 1B:
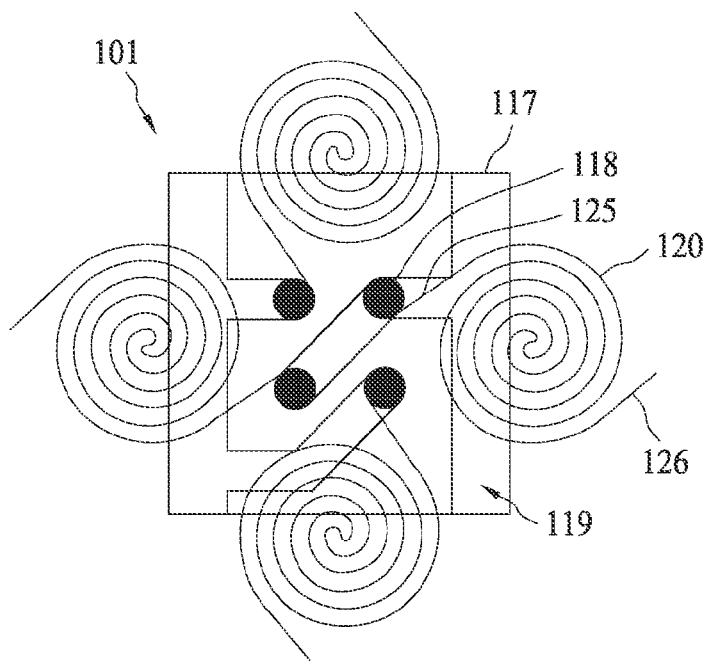
FIG. 1B is an amplified view of a compliable unit in the compliable network illustrated in FIG. 1A.

FIG. 1B is an amplified view of a compliable unit 101 in the compliable network 10 illustrated in FIG. 1A. Referring to FIG. 1B, the compliable unit 101 may include one or more compliable elements 120 in the compliable structure layer 12, each having a spiral shape, and include one or more device components in the device layer 11 associated with the one or more compliable elements 120. In the present embodiment, the one or more compliable elements 120 may each connect at one end 125 with one of device nodes 118, and connect at another end 126 with another device node (not shown) or another compliable element (not shown). In other embodiments, however, the compliable element 120 may include three or more ends, some of which are configured to connect with device nodes while others are configured to connect with other compliable elements.

The device nodes 118 may each serve as a circuit node in an electrical path between one or more compliable elements 120 and one or more device components. In the present embodiment, the device nodes 118 are coupled to a carrier or interposer 117, which holds one or more device components thereon and facilitates wire routing. In other embodiments, the device nodes 118 may form a part of the device layer 11 and/or a part of the compliable structure layer 12 to allow direct physical and electrical connection between the device layer 11 and the compliable structure layer 12 without any interposers.

Figure 1C:
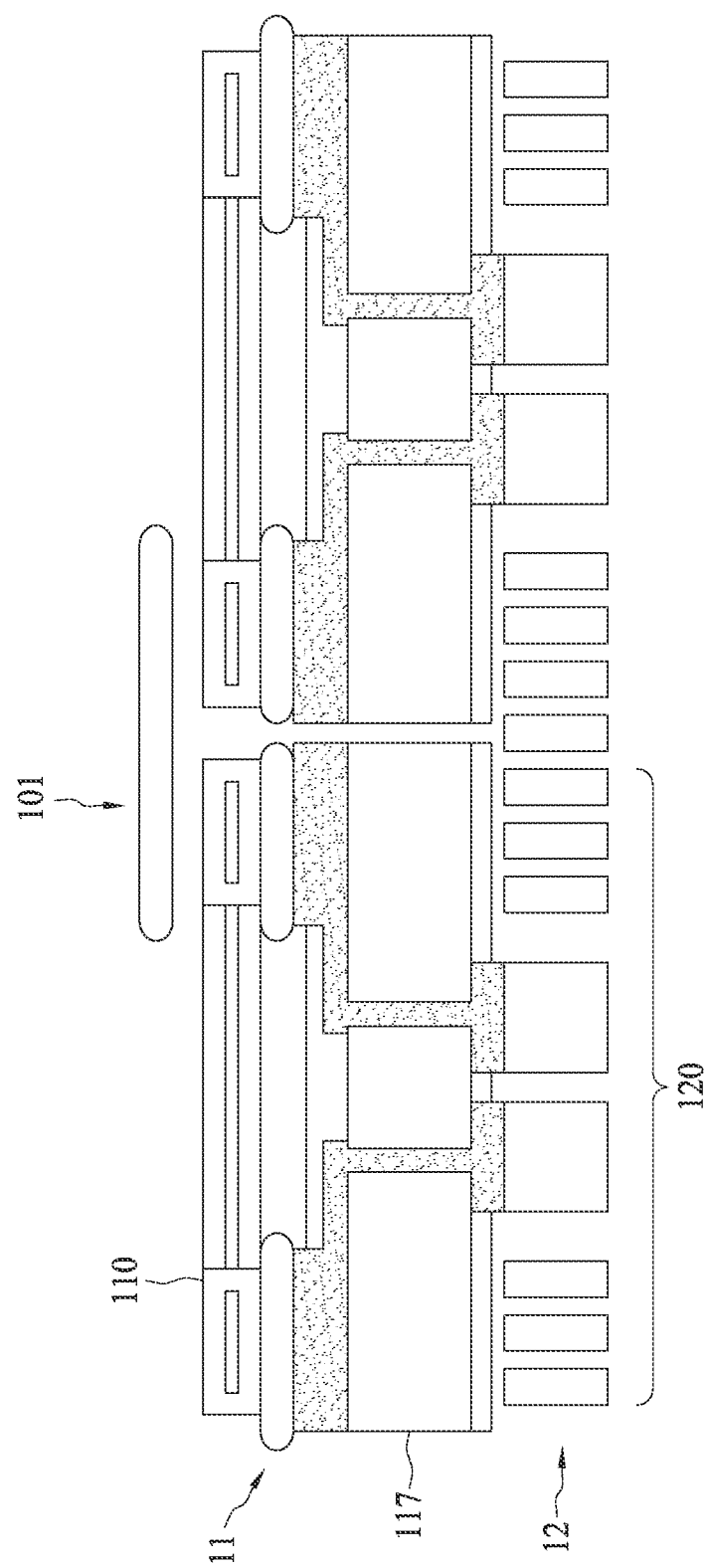
FIG. 1C is a cross-sectional view of the compliable unit in the compliable network illustrated in FIG. 1A.

FIG. 1C is a cross-sectional view of the compliable unit 101 in the compliable network 10 illustrated in FIG. 1A. Referring to FIG. 1C, the compliable unit 101 may also include a multi-layer structure, that is, the compliable structure layer 12 further including the one or more compliable elements 120, and the device layer 11 including one or more device components 110 with the interposer 117 attached to the compliable structure layer 12.

In one embodiment, the device components 110 in the device layer 11 may include at least one of silicon-compatible semiconductor components and non-silicon components. Examples of the silicon-compatible components may include but are not limited to processor chips, complementary metal-on-oxide (CMOS) devices, micro electromechanical systems (MEMS), solar cells, transducers such as those of piezoelectric materials, silicon-based light emitting diodes (LEDs), piezoresistive sensors, capacitive sensors, chemical vapor deposition (CVD) fabricated devices, physical vapor deposition (PVD) fabricated devices, thermally grown devices, and epitaxially grown devices. Examples of the non-silicon components may include but are not limited to sapphire based LEDs and PZT (lead zirconate titanate).

Moreover, the device components 110 may also include other devices that offer visual, audio, tactile input/output interface, energy harvesting, transducers such as those for sensing and actuation, data processing, and wireless communication.

The interposer 117 may be provided for electrical path routing and may include through holes filled with a conductive material and insulating materials to carry signals from one side of the interposer 117 to the other side. Examples of the interposer 117 may include but are not limited to a glass substrate, a crystalline silicon (C-Si) substrate, a ceramic substrate, and a printed circuit board (PCB). Moreover, the interposer 117 may be configured to possess logic functions and energy harvesting power, or may be configured to perform at least one of the above-mentioned functions of the device components 110. In one embodiment, the interposer 117, which performs signal redistribution and/or device function, may be integrated with and thus form a part of the device layer 11. In another embodiment, the interposer 117 may be integrated with and thus form a part of the compliable structure layer 12.

Furthermore, examples of the compliable elements 120 may include crystalline silicon (C-Si), poly silicon, amorphous silicon, piezoelectric material, magnetic material, light-emitting material, transducer material, metal, dielectric, polydimethylsiloxane (PDMS), polymers, alloys, hybrid materials, materials grown by self-assembly, direct growth techniques, CVD fabrication, PVD fabrication, thermally grown or epitaxially grown materials or a combination thereof. For example, the compliable elements 120 may include metal on dielectric or silicon or nickel cobalt (NiCo) coated with gold.

Figure 1D:
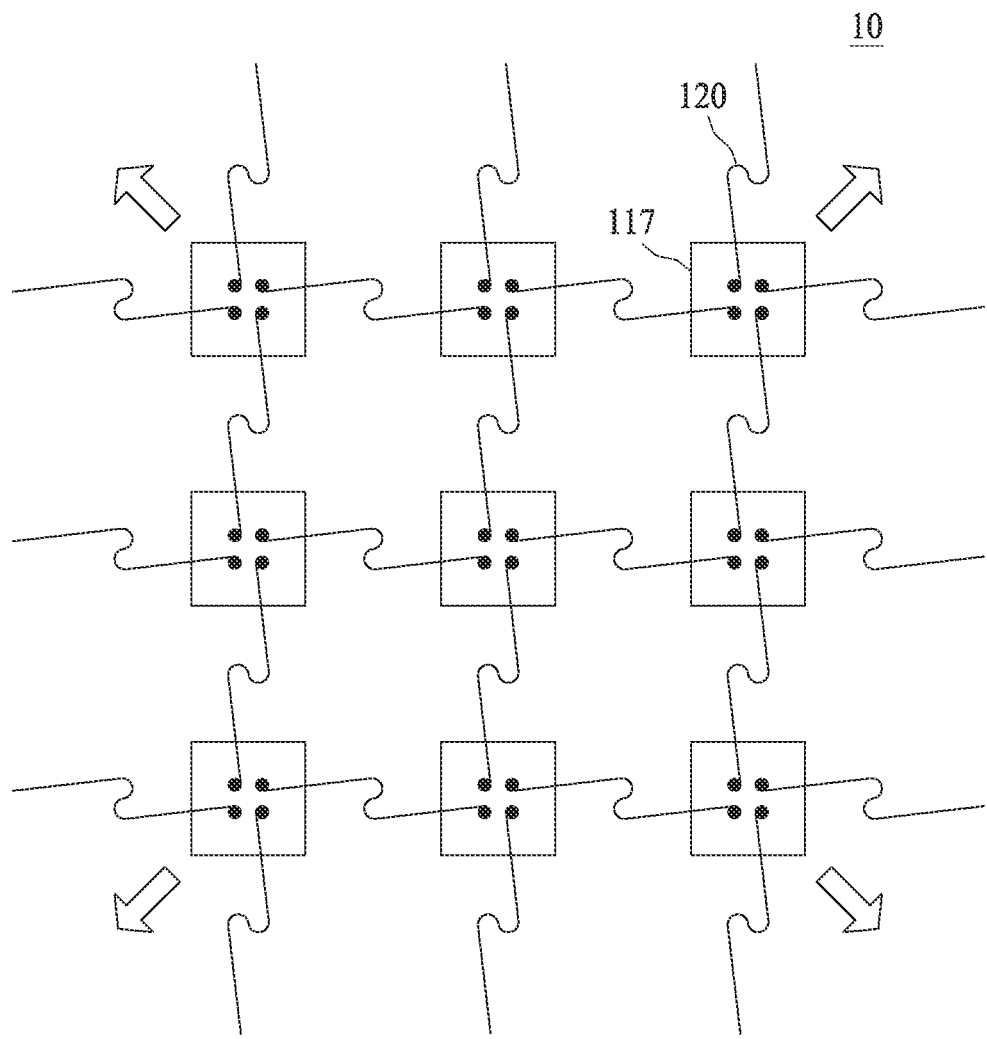
FIG. 1D is a schematic diagram illustrating an expanded state of the compliable network illustrated in FIG. 1A.

FIG. 1D is a schematic diagram illustrating an expanded state of the compliable network 10 illustrated in FIG. 1A. Also referring to FIG. 1A, the compliable structure layer 12 may be stretched to expand the device layer 11 stacked thereon at an initial or unexpanded state as illustrated in FIG. 1A to the expanded state as illustrated in FIG. 1D by, for example, applying a controlled force from at least one predetermined direction during a deployment process.

In one embodiment, some compliable units may serve as grabbing pads for deployment purposes. The grabbing pads may be a part of the device component 110 and/or the interposer 117 and/or the compliable component 120. In operation, the controlled force may be applied to at least one grabbing pad in the directions as indicated by arrows. In another embodiment, the controlled force may be applied from under the compliable network 10 to raise a portion of the compliable network 10.

Furthermore, the compliable network 10 may be contracted from an expanded state to an initial state or a half-expanded state. In one embodiment according to the present disclosure, a first set of the compliable units 101 may be stretched to expand a first set of the devices 110 associated with the first set of compliable units 101, while a second set of the compliable units 101 may be compressed to contract a second set of the devices 110 associated with the second set of compliable units 101.

In other embodiments, the device layer 11 of the compliable unit 101 or the compliable network 10 may include one or more compliable elements 120. Furthermore, the compliable structure layer 12 of the compliable unit 101 or the compliable network 10 may include one or more device components 110. In that case, the device layer 11 may be transferred to a desired location by applying a controlled force to at least one of the one or more compliable elements 120 in the device layer 11 from at least one predetermined direction during a deployment process.

The device components 110 may undergo relatively insignificant or even no deformation compared to conventional compliable networks during and after a deployment process. For example, the deformation strain may significantly be less than 1%. The compliable elements 120 may undergo relatively large deformation compared to the device components 110 during a deployment process. For example, the deformation strain may range from approximately 1% to 10%.

The compliable elements 120 may remain deformable and flexible after deployment. Moreover, after deployment of the device components 110, the compliable elements 120 in the form of a mesh of suitable materials may provide a desired function. For example, the compliable elements 120 in a metal mesh may support capacitive sensing.

The device components 110 after deployment may sense, detect, induce or generate changes in the environment, including, for example, air flow, water flow, electricity propagation, magnetic field, vibration, temperature change, touch, and acoustic and optical stimuli.

Figure 2A:
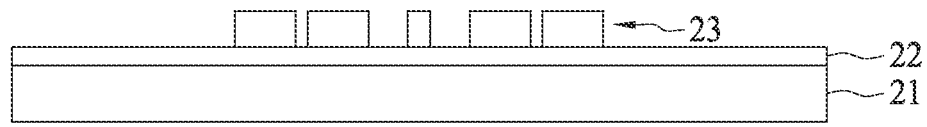
FIGS. 2A to 2E are diagrams illustrating an example method of deploying device components by using a compliable network according to an embodiment.

FIGS. 2A to 2E are diagrams illustrating an example method of deploying device components by using a compliable network according to an embodiment of the present disclosure. Referring to FIG. 2A, a sacrificial layer 22 may be formed on a temporary carrier 21. Subsequently, a compliable structure layer 23 may be formed on the sacrificial layer 22.

Figure 2B:
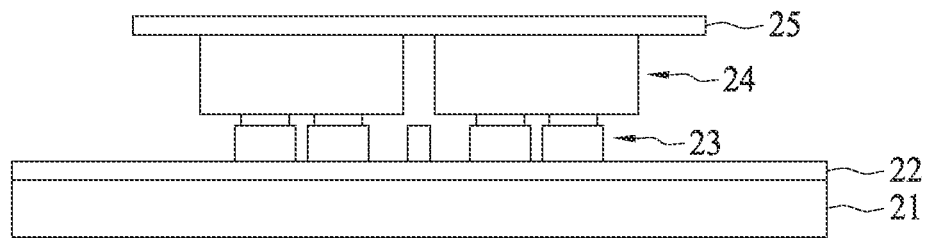

Referring to FIG. 2B, a device layer 24 with another temporary carrier 25 may be provided. The device layer 24 may then be stacked on the compliable structure layer 23. Example methods of assembling or forming a stack of the device layer 24 and the compliable structure layer 23 may include but are not limited to wafer-level bonding, direct growth by, for example, LIGA (lithography, electroplating, and molding) process, nanoimprint or microimprint techniques, and fabrication of compliable elements and device components on a substrate such as a silicon wafer.

Figure 2C:
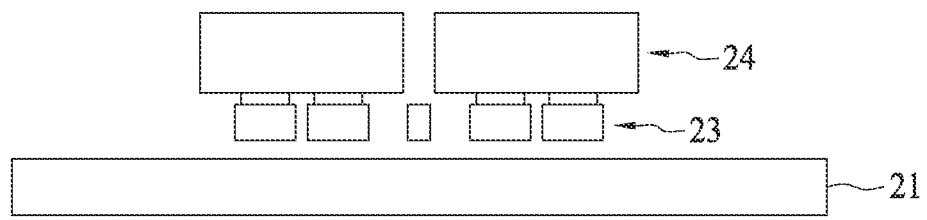

Referring to FIG. 2C, the temporary carrier 25 is removed to release the device layer 24, and the sacrificial layer 22 is removed, resulting in a compliable network.

Figure 2D:
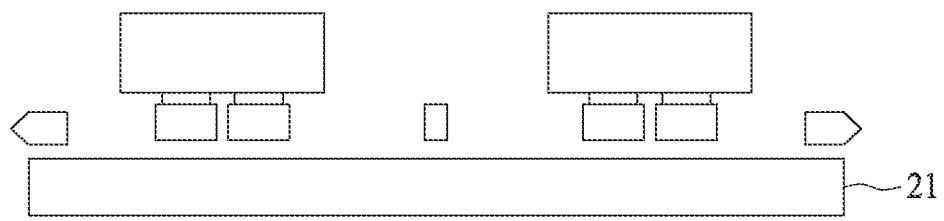

Referring to FIG. 2D, the compliable network may be transferred to a deployment platform through devices like the electro-static chuck or other tools that provide easy pick up and release of the compliable network while keeping it on a 2D plane. Subsequently, automated moving parts with grabbing fixtures may be attached to at least one grabbing pad of the compliable network, which may be located at the corners of the compliable network, along the sides of the compliable network, or inside the compliable network between or among compliable elements, as illustrated in FIG. 1D. Alternatively, tapes or other suitable carriers that are stretchable may be attached to the compliable network at one or more of the grabbing pads and then the grabbing fixtures grab onto the tape and stretch the tape apart, thereby expanding the grabbing pads apart. If a larger expansion ratio is needed, multiple grabbing and stretching steps on multiple tapes attached to multiple grabbing pads may be used to achieve the expansion ratio.

Figure 2E:
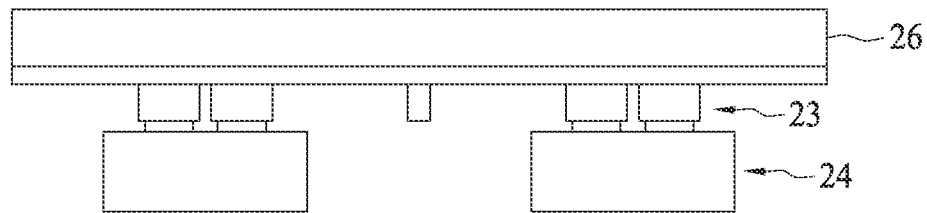

Referring to FIG. 2E, the expanded network may be attached to a substrate 26. In the present embodiment, the substrate 26 is attached to the compliable structure layer 23. In another embodiment, however, the substrate 26 may be attached to the device layer 24. In still another embodiment, the substrate 26 may include a piezoelectric element such as a polyvinylidene difluoride (PVDF) sheet.

FIGS. 3A to 3G are diagrams illustrating an example method of forming a compliable network according to an embodiment of the present disclosure.

Figure 3A:
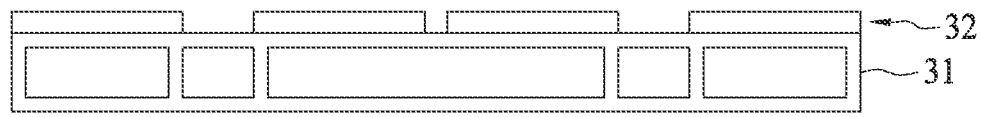
FIGS. 3A to 3G are diagrams illustrating an example method of forming a compliable network according to an embodiment.

Referring to FIG. 3A, a patterned conductive layer 32 may be formed on a first side of a carrier 31 such as a through silicon via (TSV) substrate by, for example, a lithography process or other suitable processes.

Figure 3B:
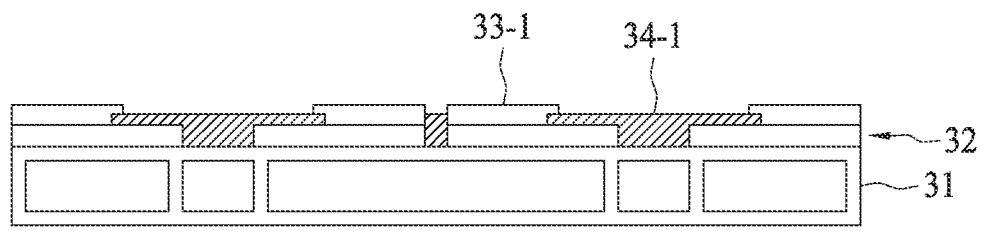

Referring to FIG. 3B, a patterned under bump metal (UBM) layer 33-1 and a patterned insulating layer 34-1 may be formed on the patterned conductive layer 32. UBMs in the patterned UBM layer 33-1 serve as bond pads.

Figure 3C:
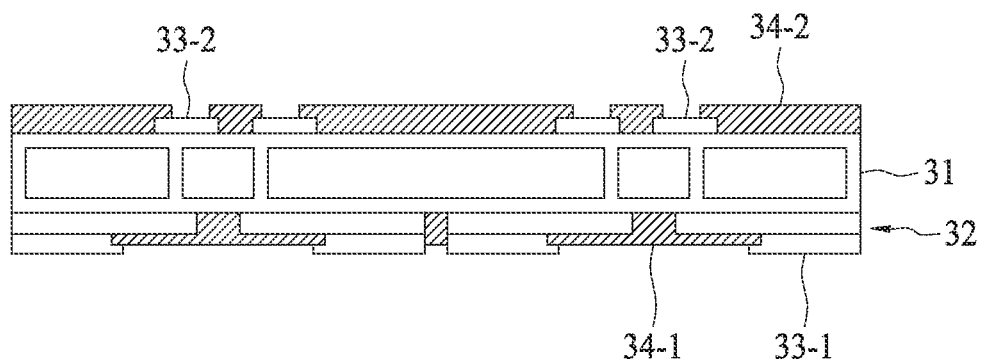

Referring to FIG. 3C, a patterned conductive layer 33-2 and a patterned insulating layer 34-2 may be formed on a second side of the carrier 31, using the similar processes that form the patterned UBM layer 33-1 and the patterned insulating layer 34-1.

Figure 3D:
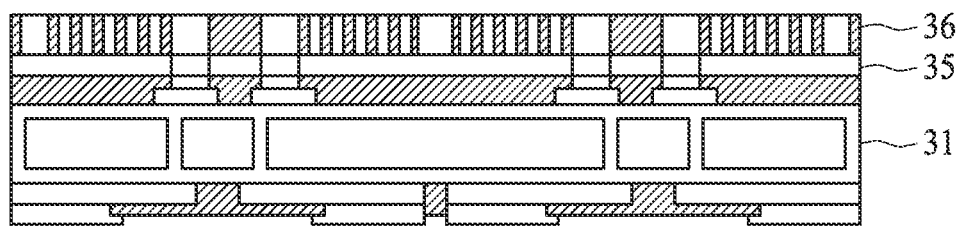

Next, referring to FIG. 3D, a patterned sacrificial layer 35 is formed on the patterned conductive layer 33-2 and the patterned insulating layer 34-2. A patterned polymer layer is then formed on patterned sacrificial layer 35 by, for example, a lithographic process followed by a polymer molding process. Subsequently, a compliable layer 36 is formed by, for example, a plating process using NiCo as the compliable material.

Figure 3E:
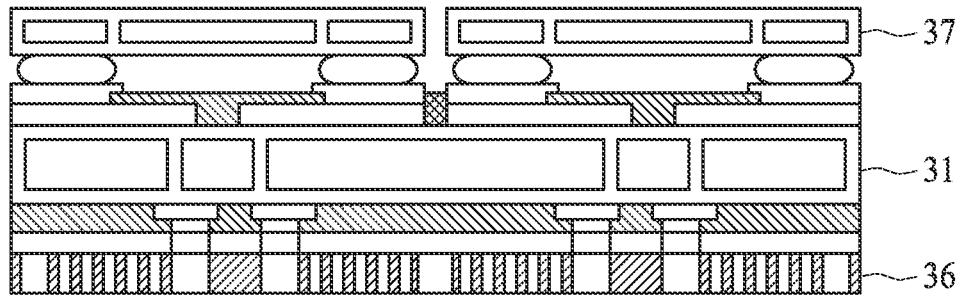

Referring to FIG. 3E, device components 37, for example, wafer-level device components, are attached to the bond pads, i.e., the patterned UBM layer 33-1, resulting in a device layer.

Figure 3F:
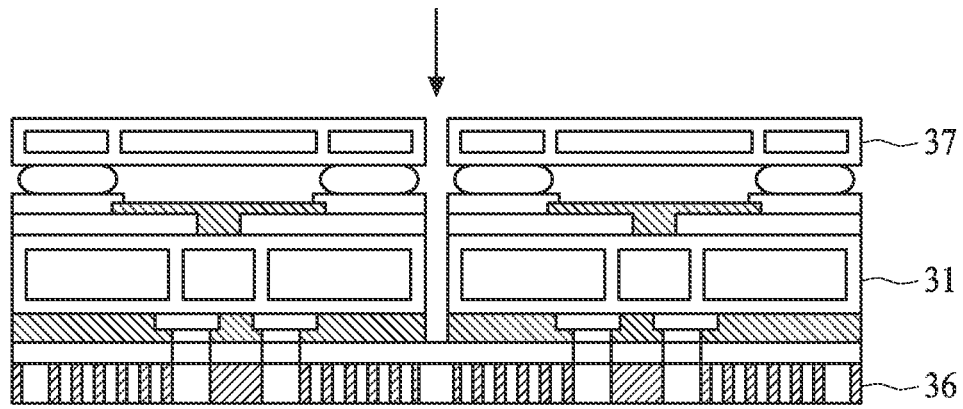
Figure 3G:
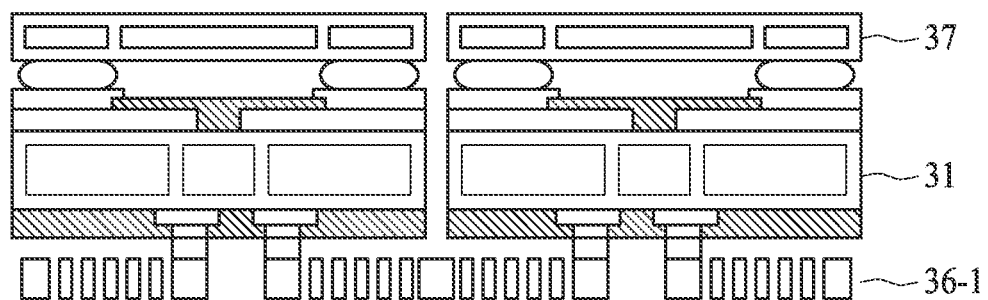

Referring to FIG. 3F, a dicing process is performed to separate the device components 37. Subsequently, referring to FIG. 3G, a compliable structure layer 36-1 is formed by removing polymer in the compliable layer 36, resulting in compliable units each comprising at least one device component stacked on at least one compliable element.

Figure 4A:
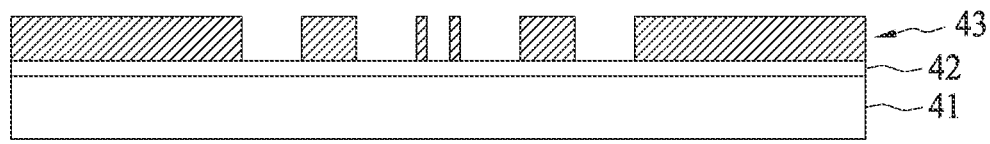
FIGS. 4A to 4H are diagrams illustrating an example method of forming a compliable network according to another embodiment.

FIGS. 4A to 4H are diagrams illustrating an example method of forming a compliable network according to another embodiment of the present disclosure. Referring to FIG. 4A, a seed layer 42 of, for example, titanium tungsten (TiW), may be formed on a substrate 41 such as a glass substrate. Next, a patterned photoresist layer 43 may be formed on the seed layer 42.

Figure 4B:
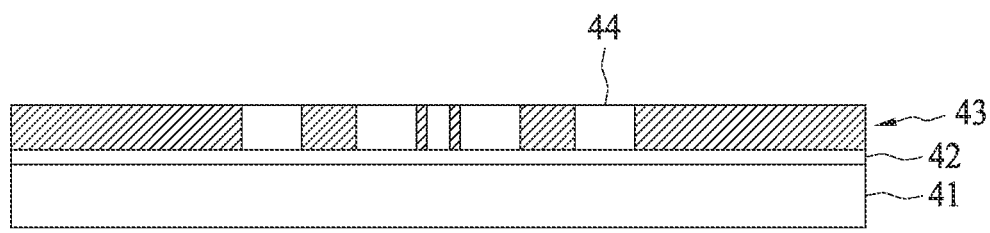

Referring to FIG. 4B, a patterned conductive layer 44 may be formed on the patterned photoresist layer 43 by, for example, a plating process followed by a lapping process. In one embodiment, the patterned conductive layer 44 includes copper (Cu).

Figure 4C:
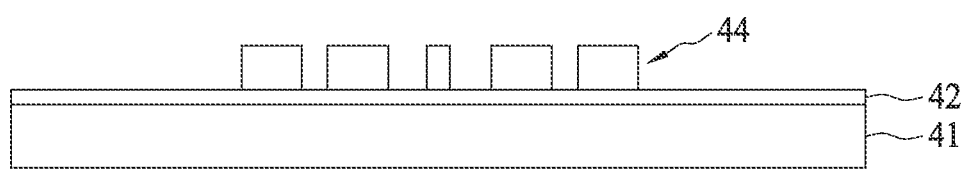

Referring to FIG. 4C, the patterned photoresist layer 43 is stripped to totally expose the patterned conductive layer 44, which serves as a compliable structure layer.

Figure 4D:
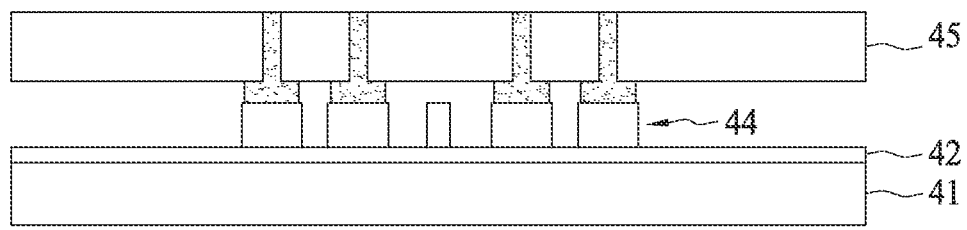

Referring to FIG. 4D, a device layer 45 on a glass substrate 45 with conductive vias and solder bumps may be attached to the patterned conductive layer 44 by, for example, an eutectic bonding process.

Figure 4E:
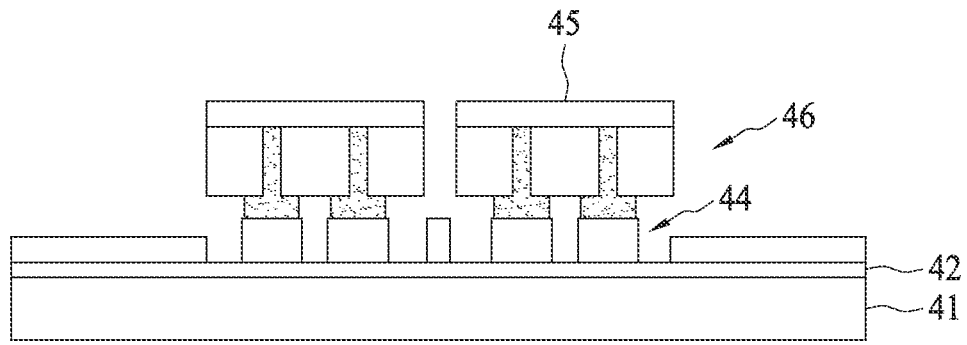

Next, referring to FIG. 4E, a dicing process is performed to separate device components in the device layer 45, resulting in compliable units 46. In one embodiment, the dicing process is performed with the aid of an electronic gun.

Figure 4F:
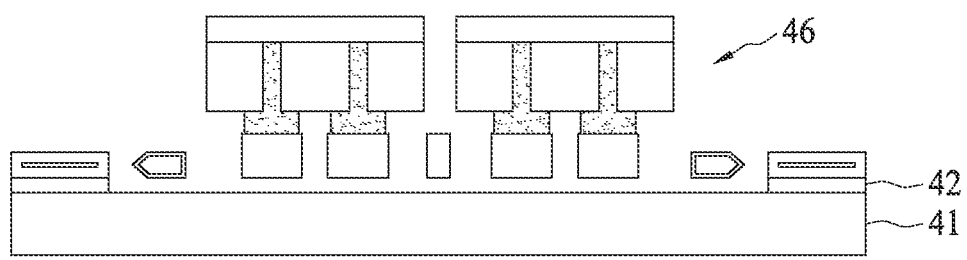

Referring to FIG. 4F, portions of the seed layer 42 may be removed by an etching process to release the compliable units 46. Subsequently, the compliable units 46 may be stretched or compressed by a controlled force to transfer the device components to a desired location.

Figure 4G:
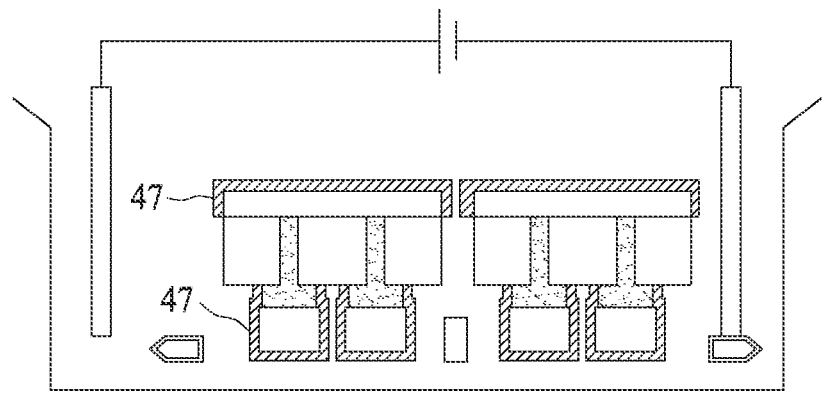

Optionally, referring to FIG. 4G, an insulator layer 47 may be coated on the resultant compliable network as illustrated in FIG. 4F by, for example, an electroplating process. Accordingly, at least one of the device layer or the compliable structure layer of the compliable network are coated with an insulator layer.

Figure 4H:
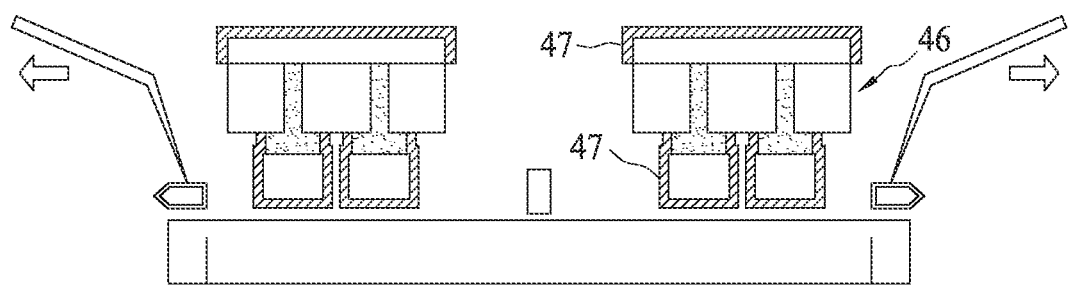

Referring to FIG. 4H, the compliable network may be expanded or contracted on the glass substrate 41 by a controlled force to transfer the device components to a desired location during a deployment process.

Alternatively, a lubricant layer may be coated on at least one of the device layer or the compliable structure layer of the compliable network to facilitate movement of the compliable structure layer or compliable elements during a deployment process.

Figure 5A:
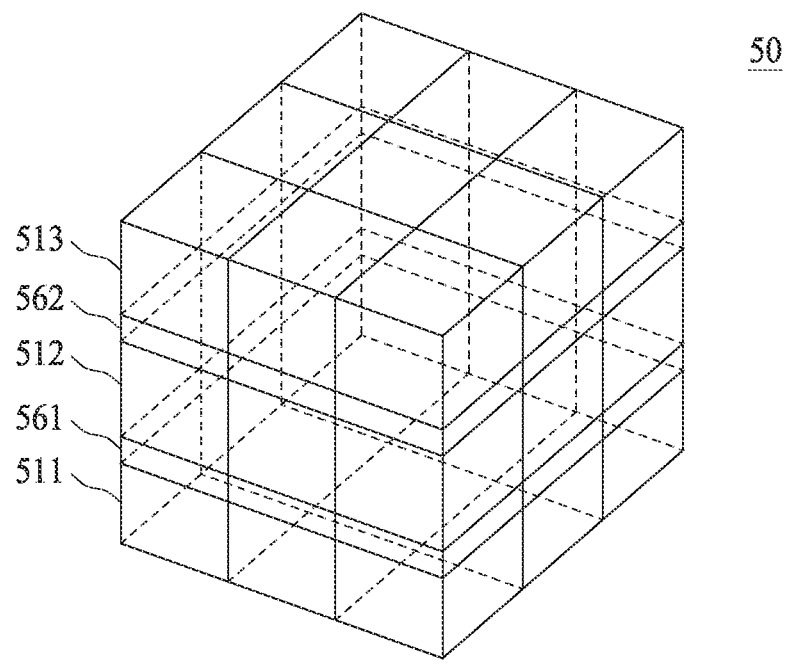
FIG. 5A is a schematic perspective view of a three-dimensional (3D) compliable network according to an embodiment.

FIG. 5A is a schematic perspective view of a three-dimensional (3D) compliable network 50 according to an embodiment of the present disclosure. Referring to FIG. 5A, multiple compliable networks may be stacked or layered together to achieve desired functions. Specifically, the 3D compliable network 50 may include a first device layer 511, a first compliable structure layer 561 stacked on the first device layer 511, and a second device layer 512 stacked on the first compliable structure layer 561. Moreover, the 3D compliable network 50 may further include a second compliable structure layer 562 stacked on the second device layer 512, and a third device layer 513 stacked on the second compliable structure layer 562.

In implementation, taking LED displays for example, a 3D compliable network may be configured such that each of device layers includes device components of all three colors (RGB). Alternatively, the 3D compliable network may be configured such that each of the device layers includes device components of only the red color, green color and blue color.

Figure 5B:
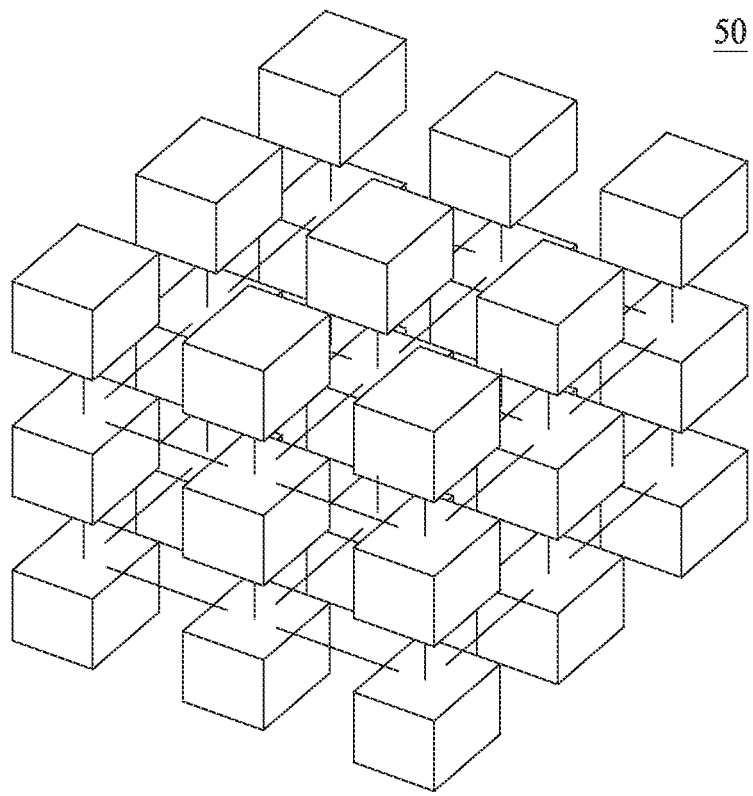
FIG. 5B is a diagram illustrating an expanded state of the compliable network illustrated in FIG. 5A.

FIG. 5B is a diagram illustrating an expanded state of the 3D compliable network 50 illustrated in FIG. 5A. In other embodiments, the 3D compliable network 50 may be contracted from the expanded state to an initial state as illustrated in FIG. 5A or to a half expanded state.

Figure 5C:
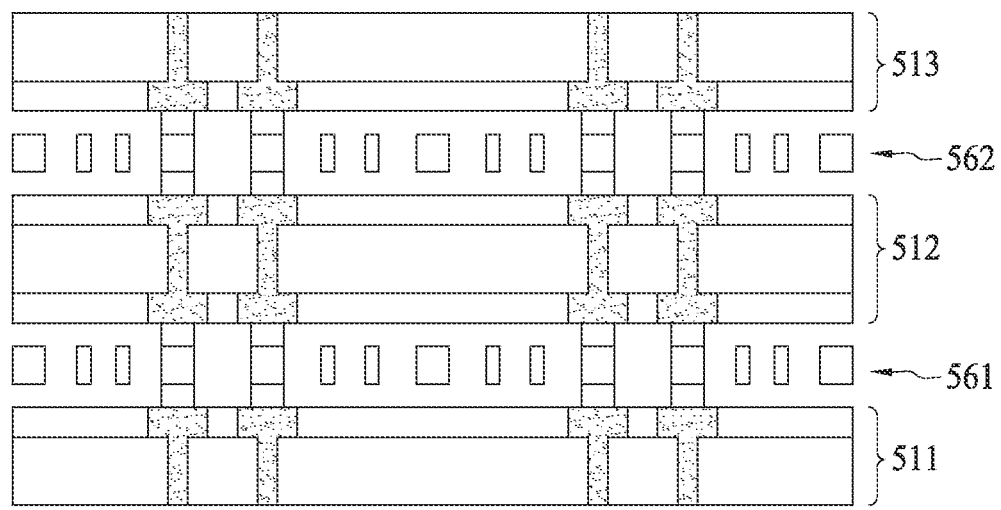
FIG. 5C is a cross-sectional view of the compliable network illustrated in FIG. 5A.

FIG. 5C is a cross-sectional view of the 3D compliable network 50 illustrated in FIG. 5A. Although in the present embodiment the compliable network 50 includes two compliable structure layers 561, 562 sandwiched by three device layers 511, 512, 513, a person skilled in the art will understand that other configurations or forms of the compliable network 50 are possible, including different numbers and/or different stacking fashions of the device layers and the compliable structure layers.

Figure 6:
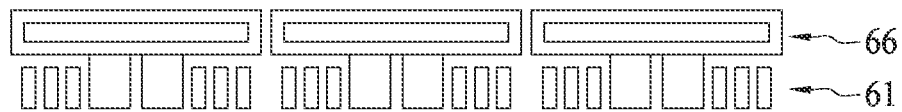
FIG. 6 is a schematic cross-sectional view of a compliable unit according to an embodiment.

FIG. 6 is a schematic cross-sectional view of a compliable unit/network according to an embodiment of the present disclosure. Referring to FIG. 6, the compliable unit/network may include a compliable structure layer 61 composed of compliable elements, and a device layer 66, stacked on the compliable structure layer 61, composed of device components.

Figure 7A:
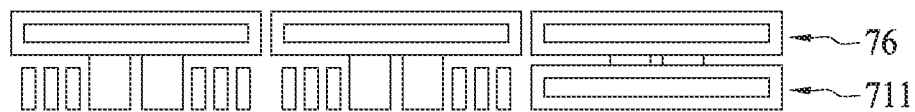
FIGS. 7A and 7B are schematic cross-sectional views of compliable units according to another embodiment.
Figure 7B:
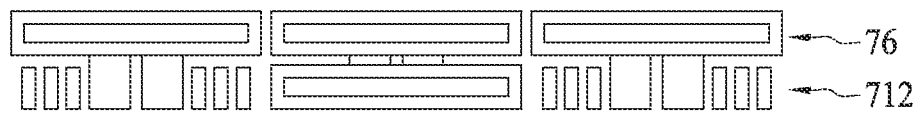

FIGS. 7A and 7B are schematic cross-sectional views of compliable units/networks according to another embodiment of the present disclosure. Referring to FIG. 7A, the compliable unit/network may include a compliable structure layer 711 including compliable elements at a first region and at least one device component at a second region, and a device layer 76, stacked on the compliable structure layer 711, composed of device components.

Referring to FIG. 7B, the compliable unit/network may be similar to that described and illustrated with respect to FIG. 7A except that, for example, a compliable structure layer 712 may include at least one device component between or among compliable elements.

Figure 8A:
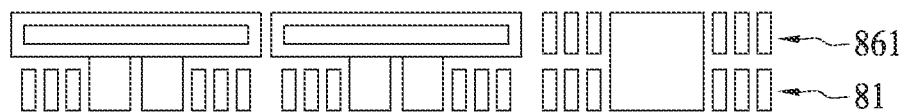
FIGS. 8A and 8B are schematic cross-sectional views of compliable units according to still another embodiment.
Figure 8B:
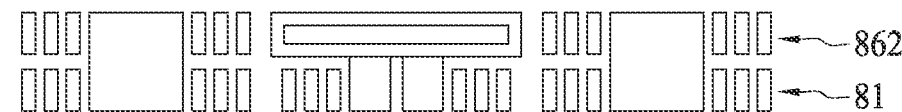

FIGS. 8A and 8B are schematic cross-sectional views of compliable units/networks according to still another embodiment of the present disclosure. Referring to FIG. 8A, the compliable unit/network may include a compliable structure layer 81 composed of compliable elements, and a device layer 861, stacked on the compliable structure layer 81, including device components at a first region and at least one compliable element at a second region.

Referring to FIG. 8B, the compliable unit/network may be similar to that described and illustrated with respect to FIG. 8A except that, for example, a device layer 862 may include at least one device component between or among compliable elements. In other embodiments, the device layer 862 may include at least one compliable element between or among device components.

Figure 9A:
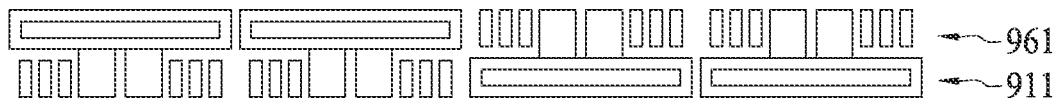
FIGS. 9A to 9C are schematic cross-sectional views of compliable units according to yet another embodiment.
Figure 9B:
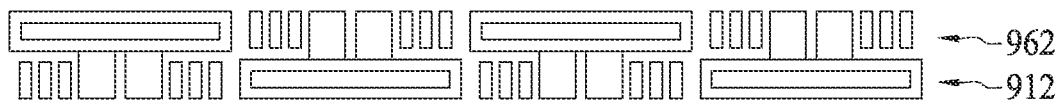
Figure 9C:
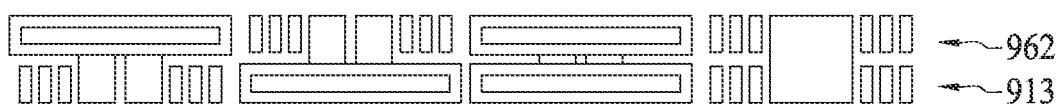

FIGS. 9A to 9C are schematic cross-sectional views of compliable units/networks according to yet another embodiment of the present disclosure. Referring to FIG. 9A, the compliable unit/network may include a compliable structure layer 911 including compliable elements at a first region and device components at a second region, and a device layer 961, stacked on the compliable structure layer 911, including device components at a first region and compliable elements at a second region.

Referring to FIG. 9B, the compliable unit/network may be similar to that described and illustrated with respect to FIG. 9A except that, for example, a compliable structure layer 912 may include at least one device component between or among compliable elements, and a device layer 962 may include at least one device component between or among compliable elements.

Referring to FIG. 9C, the compliable unit/network may be similar to that described and illustrated with respect to FIG. 9B except that, for example, at least one device component in a device layer 963 may be stacked on at least one device component in a compliable structure layer 913. Moreover, at least one compliable element in the device layer 963 may be stacked on at least one compliable element in the compliable structure layer 913.

Figure 10A:
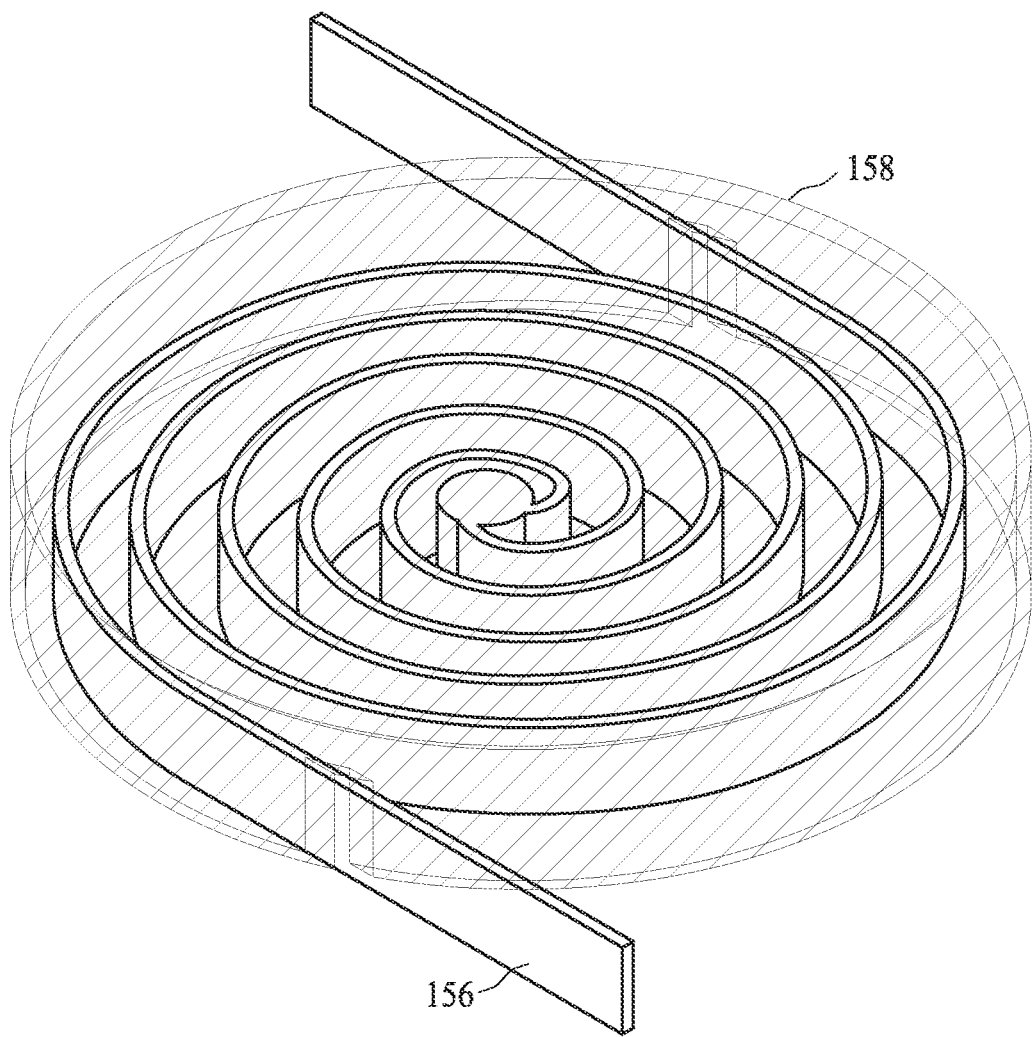
FIGS. 10A and 10B are a perspective view and a schematic view, respectively, of a capped compliable element according to an embodiment.
Figure 10B:
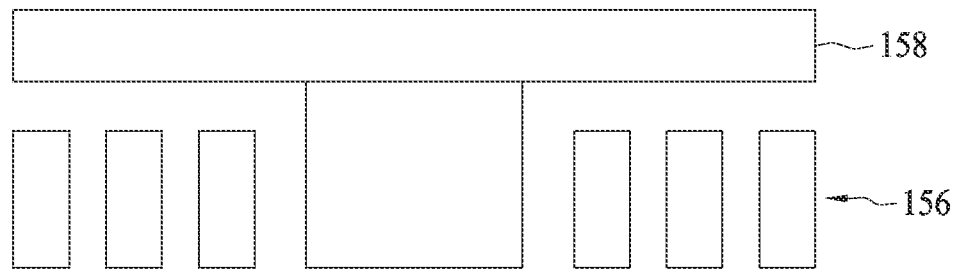

FIGS. 10A and 10B are a perspective view and a schematic view, respectively, of a capped compliable element 150 according to an embodiment of the present disclosure. Referring to FIGS. 10A and 10B, the capped element 150 may include a cap 158, which may cover, for example, a coil portion and optionally a sidewall portion of a compliable element 156. The cap 158 may prevent the compliable element 156 from undesired motion such as flipping during device deployment.

Figure 10C:
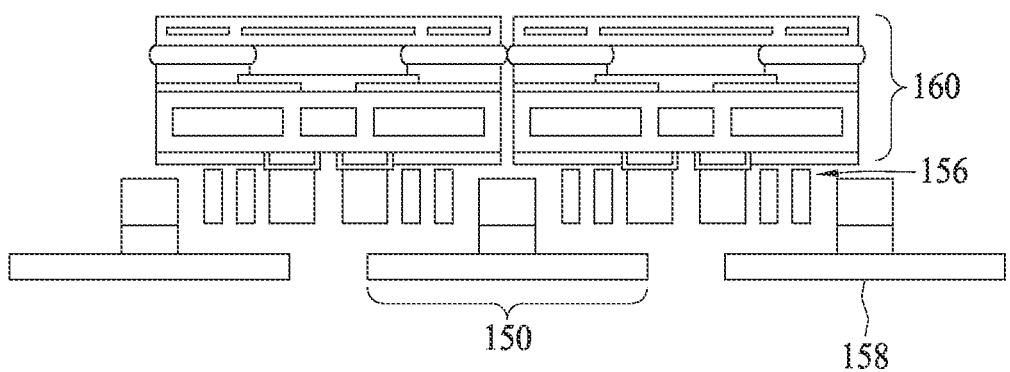
FIG. 10C is a cross-sectional view of a compliable network including capped compliable elements illustrated in FIG. 10A.

FIG. 10C is a cross-sectional view of a compliable network 100 including capped compliable elements 150 illustrated in FIG. 10A. Referring to FIG. 10C, each compliable element 156 may be isolated from other compliable elements electrically by physically separating them with one another. In one embodiment, a divider, which may include metal walls that are shaped or curved, is used so that the compliable elements are unlikely to touch one another.

Figure 11A:
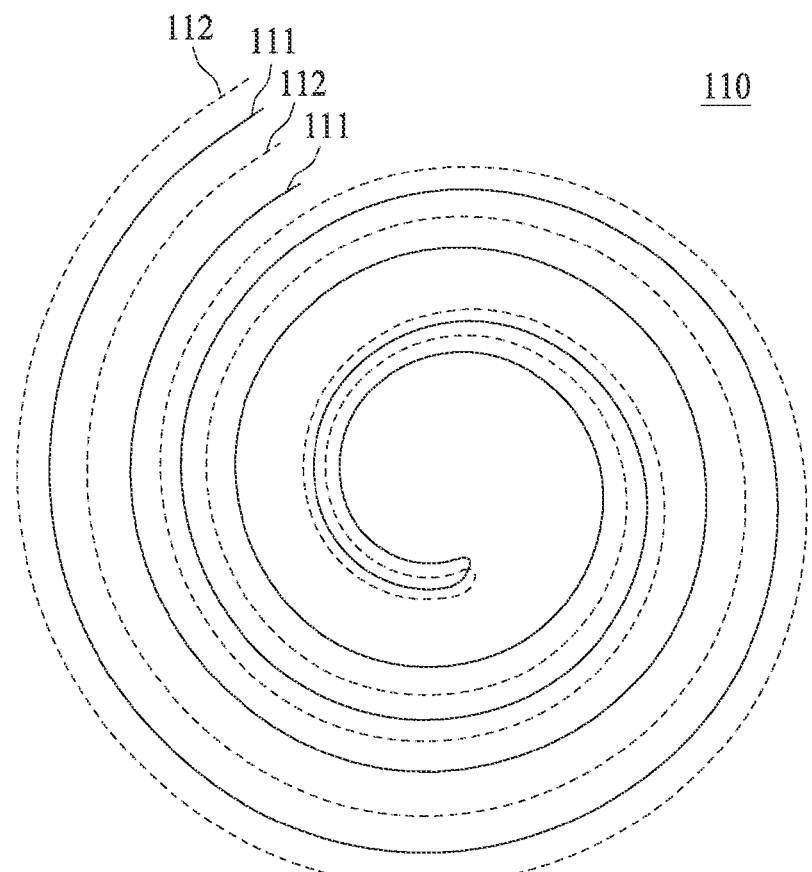
FIG. 11A is a schematic diagram of a compliable element according to an embodiment.

FIG. 11A is a schematic diagram of a compliable element 110 according to an embodiment of the present disclosure. Referring to FIG. 11A, the compliable element 110 may include a pair of first ends 111 and a pair of second ends 112. The pair of first ends 111 and the pair of second ends 112 may be intertwined with each other.

Figure 11B:
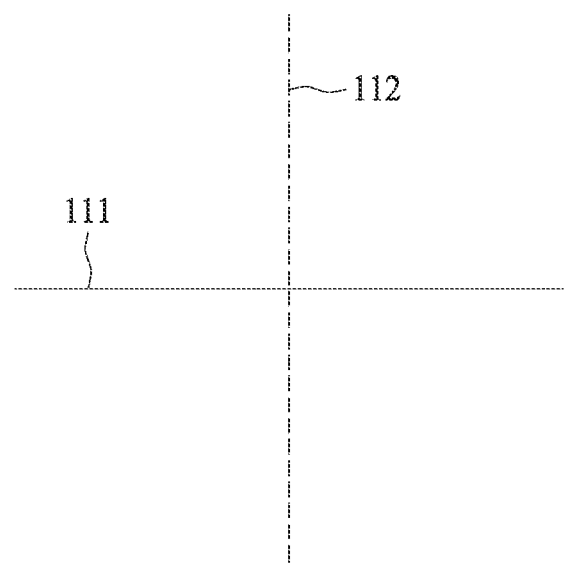
FIG. 11B is a diagram illustrating an expanded state of the compliable element illustrated in FIG. 11A.

FIG. 11B is a diagram illustrating an expanded state of the compliable element 110 illustrated in FIG. 11A. Referring to FIG. 11B, the pair of first ends 111 may be stretched in a first direction from an initial state as illustrated in FIG. 11A to an expanded state as illustrated in FIG. 11B. Moreover, the pair of first ends 111 may be compressed in the first direction from the expanded state as illustrated in FIG. 11B to the initial state as illustrated in FIG. 11A. Likewise, the pair of second ends 112 may be stretched or compressed in a second direction between an initial state as illustrated in FIG. 11A and an expanded state as illustrated in FIG. 11B. In one embodiment, the first direction may be orthogonal to the second direction.

The compliable element 110 may be designed with a predetermined number of ends configured to connect with one or more device components and/or one or more other compliable elements, and may be arranged between or among device components, as will be discussed below in more detail with respect to FIGS. 12A to 12F.

Figure 12A:
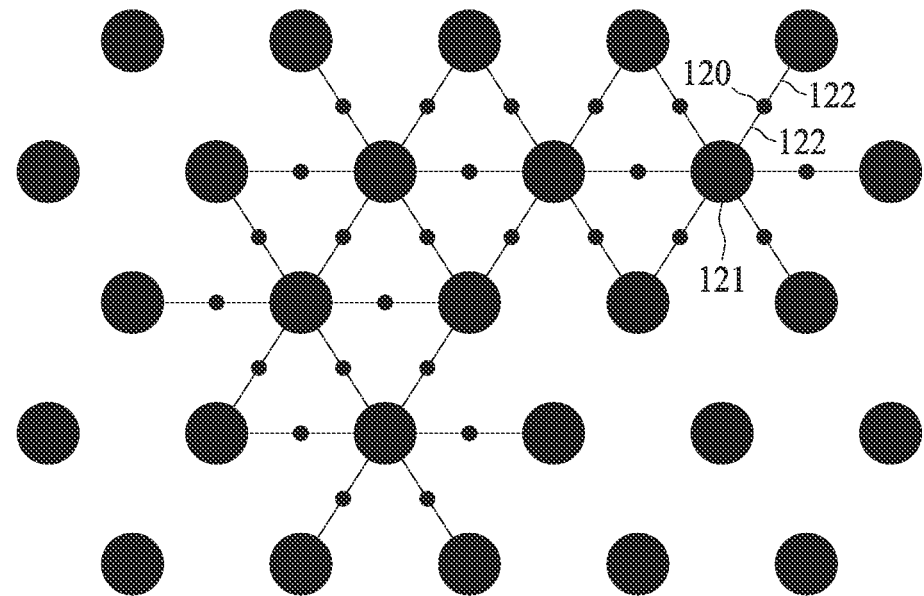
FIG. 12A to 12F are schematic diagrams illustrating example compliable networks according to embodiments.

FIG. 12A to 12F are schematic diagrams illustrating example compliable networks according to embodiments of the present disclosure. Referring to FIG. 12A, the compliable network as illustrated may include a plurality of device nodes 121 configured to be in electric or physical connection with one or more device components, and a plurality of compliable elements 122 arranged among the device nodes 121. Specifically, in the present embodiment, some of the compliable elements 122 may each be arranged between two device nodes 121 and may each include two ends 120, while some of the device nodes 121 may each be connected with six compliable elements 122.

Figure 12B:
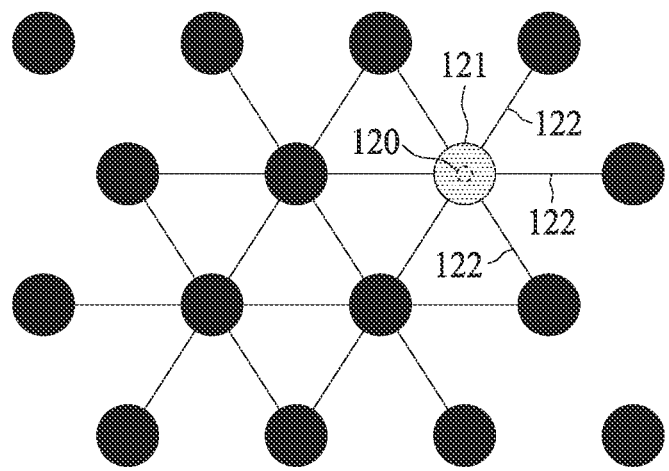

Referring to FIG. 12B, in the compliable network as illustrated, some compliable elements 122 may be arranged under device nodes 121 and may each include three ends.

Figure 12C:
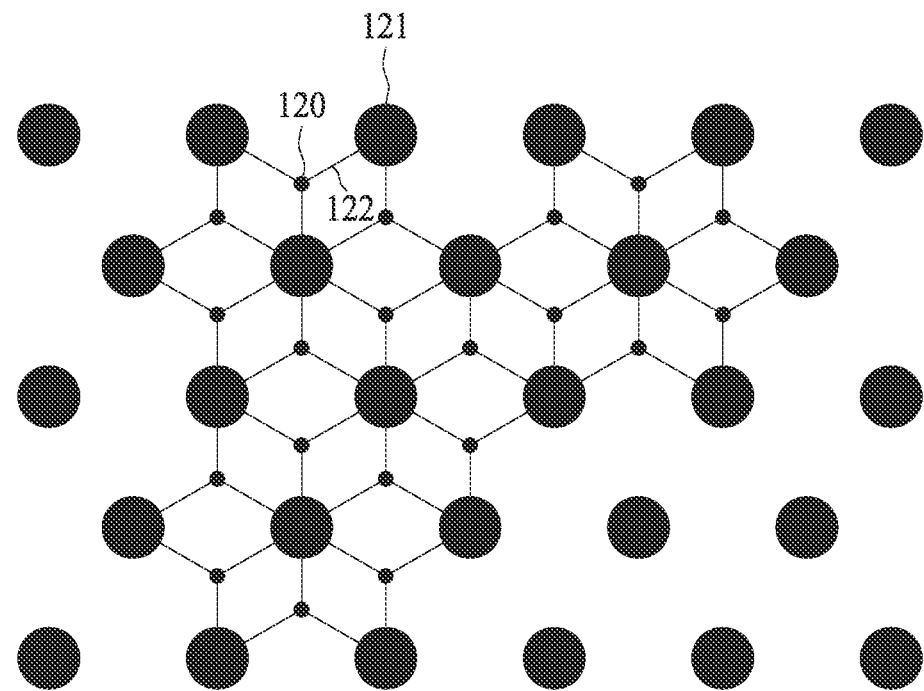

Referring to FIG. 12C, in the compliable network as illustrated, compliable elements 122 may be arranged among device nodes 121. Specifically, some of the compliable elements 122 may each be arranged among three device nodes 121 and may each include three ends 120, while some of the device nodes 121 may each be connected with six compliable elements 122.

Figure 12D:
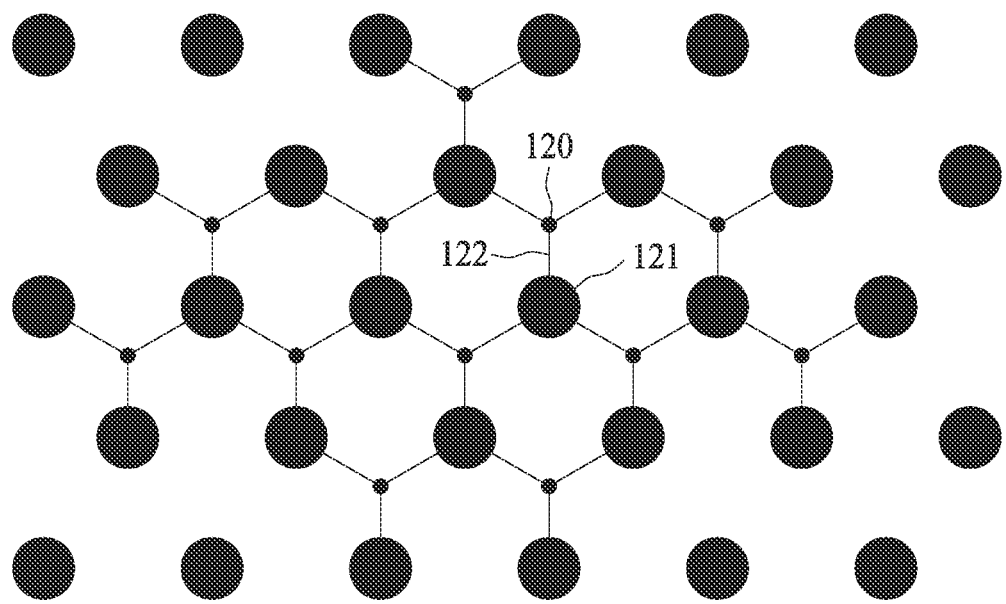

Referring to FIG. 12D, in the compliable network as illustrated, compliable elements 122 may be arranged among device nodes 121. Specifically, some of the compliable elements 122 may each be arranged among three device nodes 121 and may each include three ends 120, while some of the device nodes 121 may each be connected with three compliable elements 122.

Figure 12E:
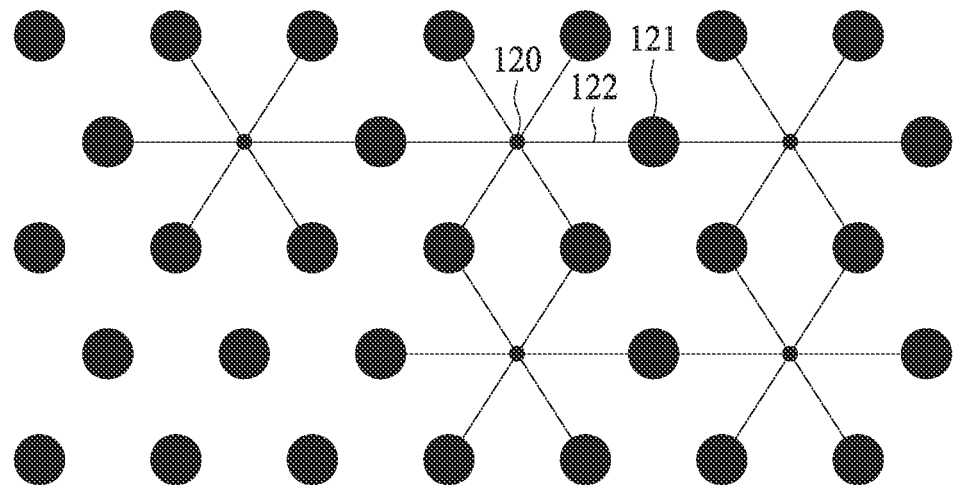

Referring to FIG. 12E, in the compliable network as illustrated, compliable elements 122 may be arranged among device nodes 121. Specifically, some of the compliable elements 122 may each be arranged among six device nodes 121 and may each include six ends 120, while some of the device nodes 121 may each be connected with two compliable elements 122.

Figure 12F:
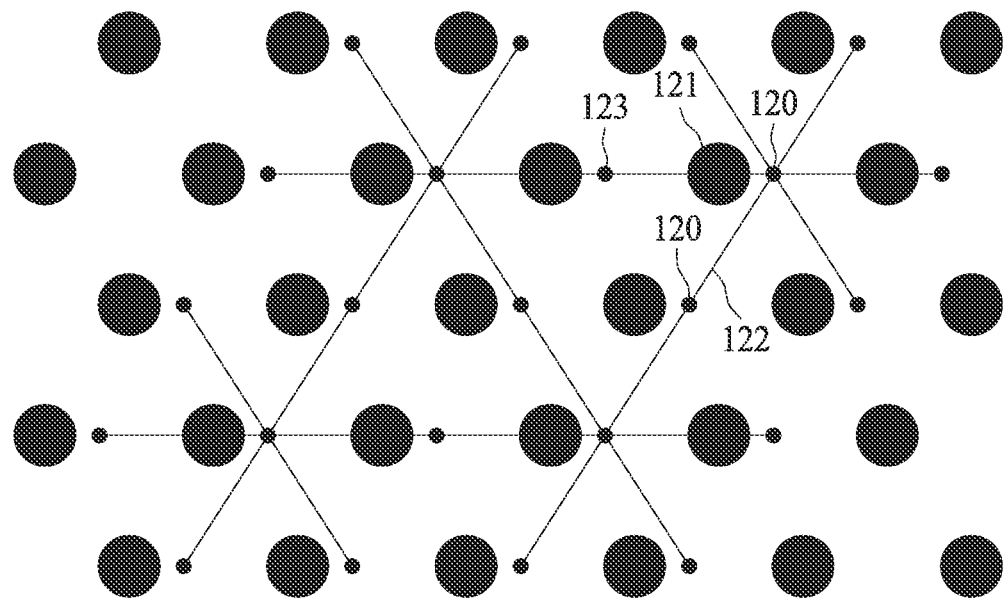

Referring to FIG. 12F, in the compliable network as illustrated, compliable elements 122 may be arranged among device nodes 121. Moreover, some of the compliable elements 122 may be connected with other compliable elements 122. Specifically, some of the compliable elements 122 may each include six ends 120, with two ends to connect with their respective device nodes and four ends to connect with other compliable elements.

Accordingly, the compliable elements 122 in the compliable network may be configured with different length or design. Furthermore, the device nodes 121 may be connected to a predetermined number of compliable elements 122.

Figure 13A:
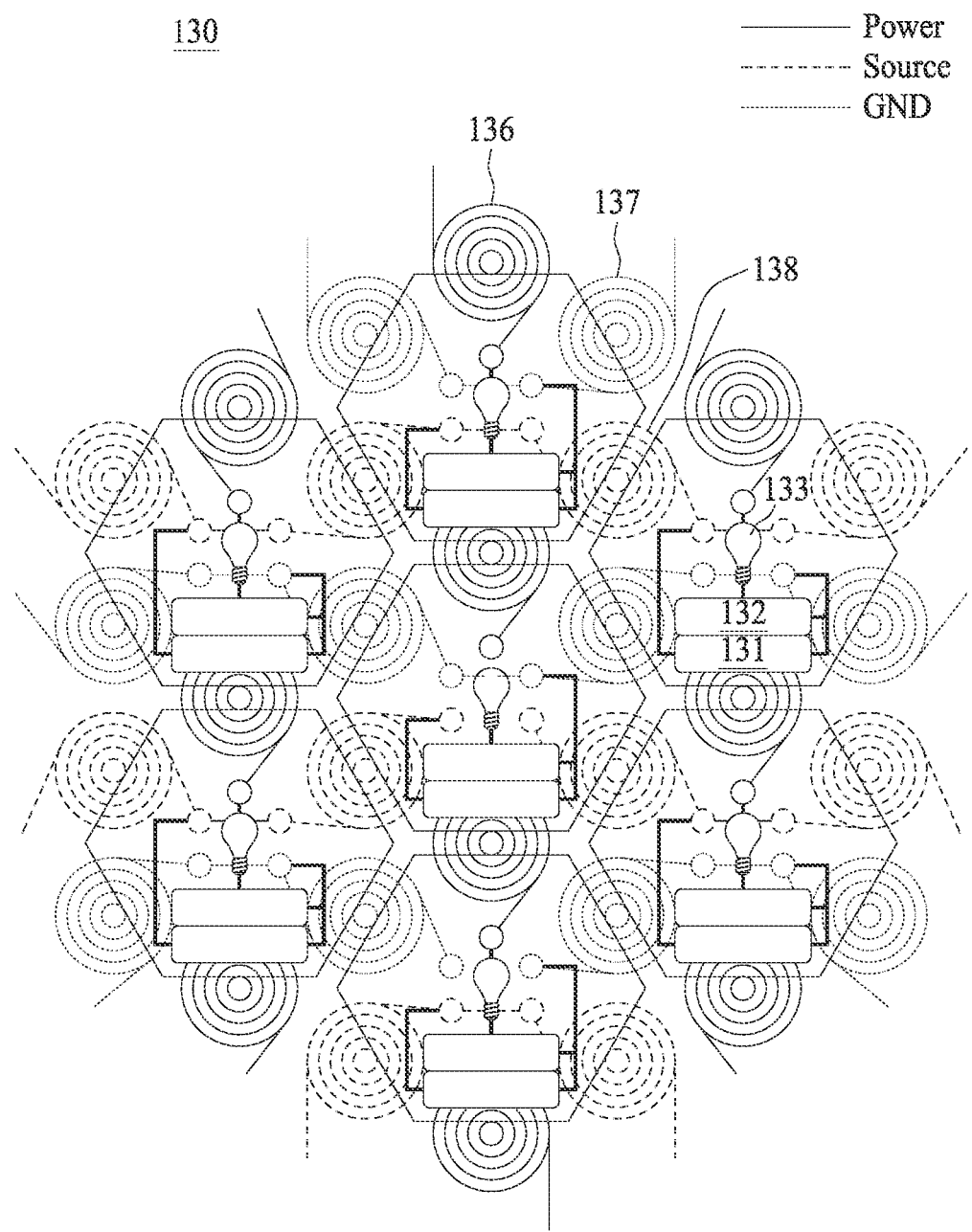
FIG. 13A is a schematic top view illustrating an example compliable network according to an embodiment.

FIG. 13A is a schematic top view illustrating an example compliable network 130 according to an embodiment of the present disclosure in implementation. Referring to FIG. 13A, the compliable network 130 may include a number of compliable units each further including a device layer and a compliable structure layer. The device layer may include device components comprising a phototransistor 131, a transistor 132, and an LED 133. The compliable structure layer may include compliable elements 136, 137 and 138, which may not have the same shape or have the same functions. For example, in the present embodiment, the compliable elements 136 are connected to a power source, the compliable elements 137, shown in a dotted circle, are connected to ground, and the compliable elements 138, shown in a dash-lined circle, are connected to a signal source. Accordingly, at least one of the compliable elements 136, 137, and 138 may be configured to transmit power, carry signals, generate energy or signal, or induce physical, electromagnetic, optical, and/or acoustic changes in the surroundings. Moreover, in other embodiments, at least one of the compliable elements 136, 137, and 138 may be configured to serve as an antenna.

Figures 13B, 13C:
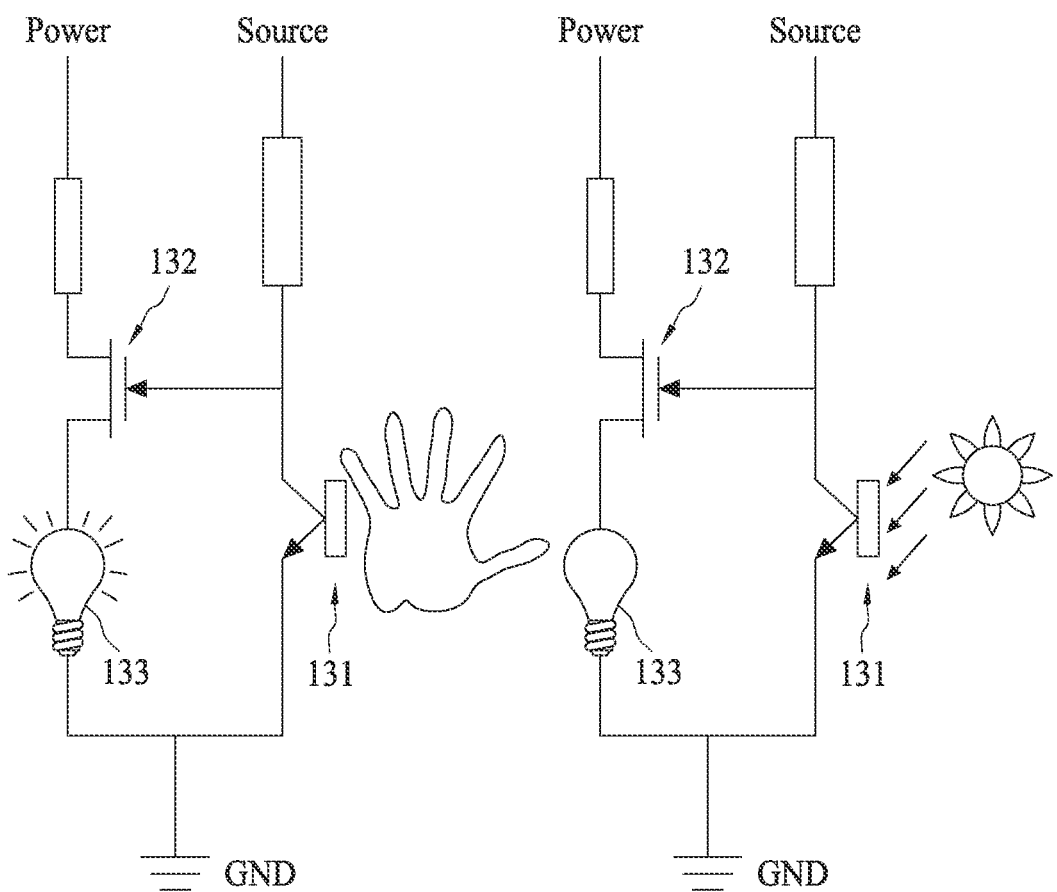
FIGS. 13B and 13C are equivalent circuit diagrams of the compliable network illustrated in FIG. 13A.

FIGS. 13B and 13C are equivalent circuit diagrams of the compliable network 130 illustrated in FIG. 13A. In operation, the phototransistor 131 may be configured to turn on the transistor 132 when it is dark, as illustrated in FIG. 13B, and turn off the transistor 132 in response to a sufficient amount of ambient light, as illustrated in FIG. 13C.

Figure 14A:
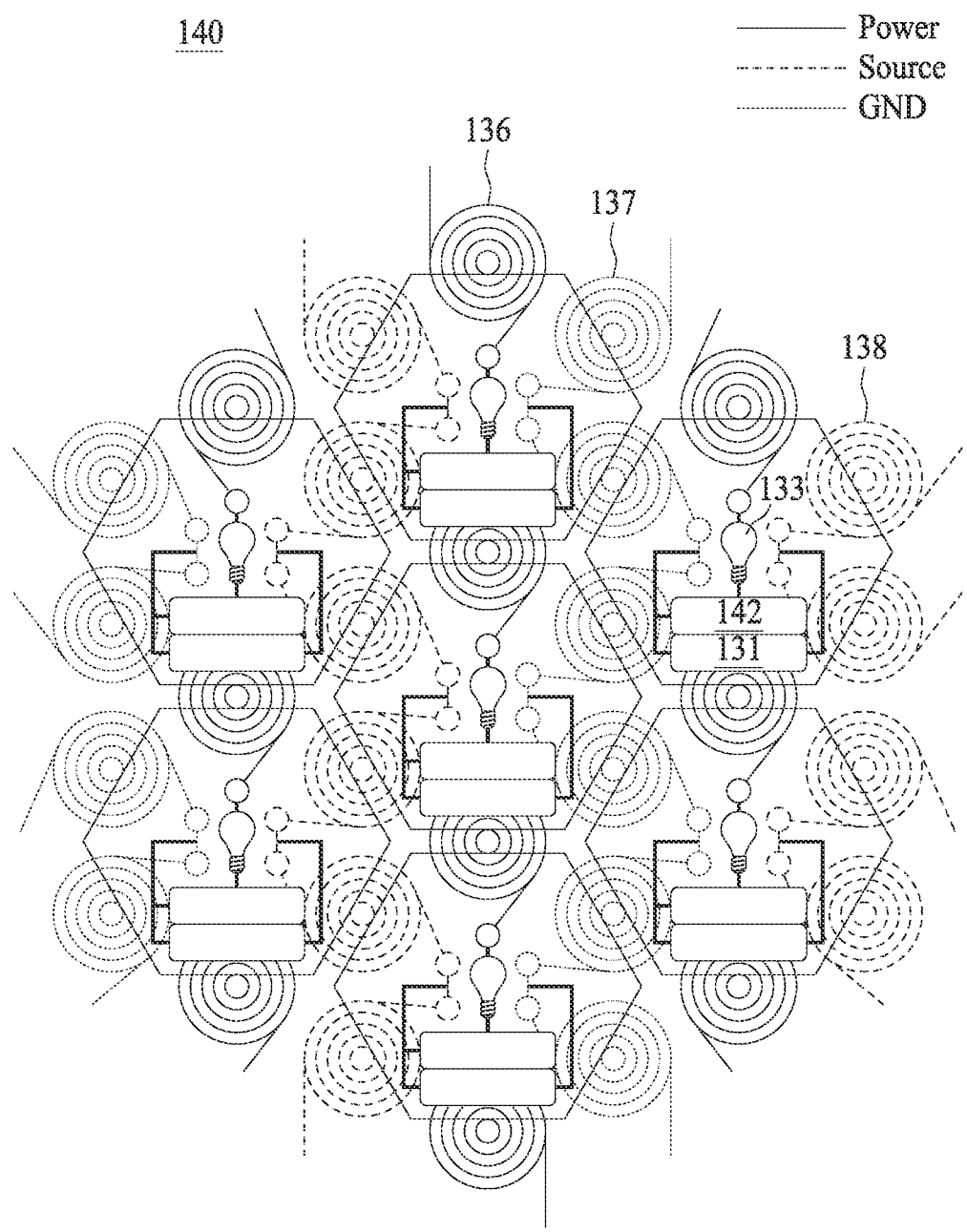
FIG. 14A is a schematic top view illustrating another example compliable network according to an embodiment.

FIG. 14A is a schematic top view illustrating another example compliable network 140 according to an embodiment of the present disclosure in implementation. Referring to FIG. 14A, the compliable network 140 is similar to the compliable network 130 described and illustrated with respect to FIG. 13A except that, for example, a MEMS switch 142 replaces the transistor 132.

Figures 14B, 14C:
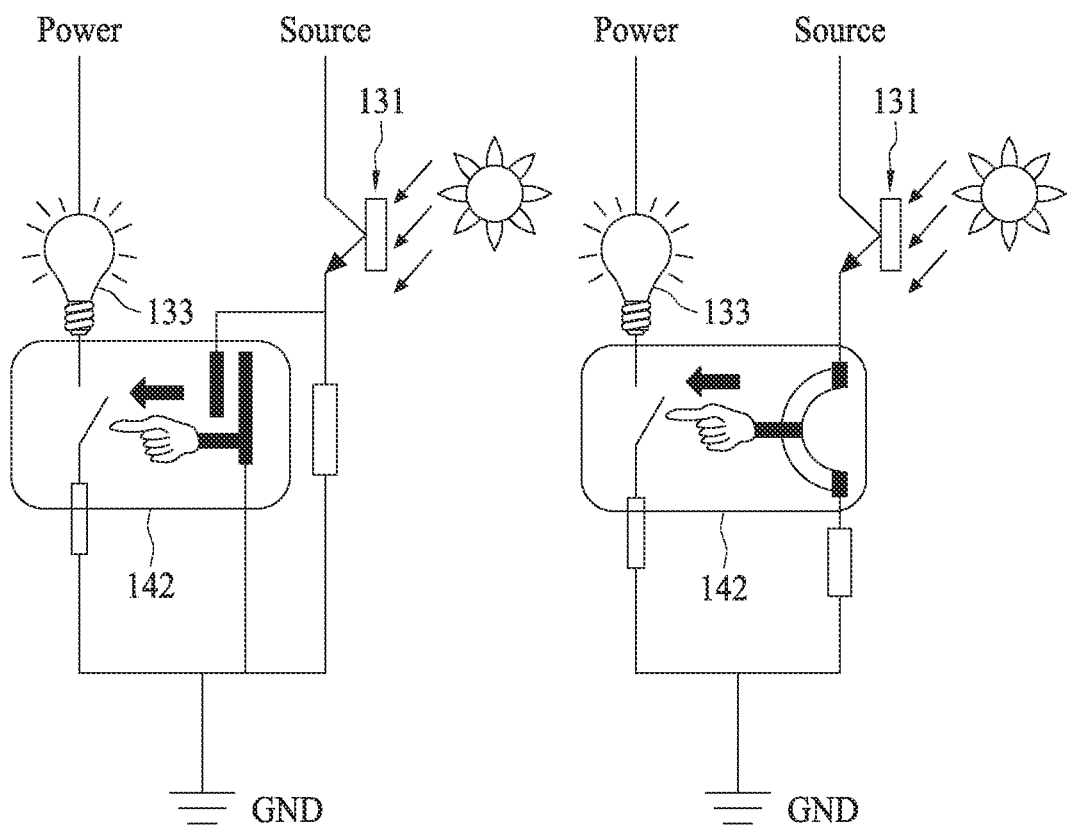
FIGS. 14B and 14C are equivalent circuit diagrams of the compliable network illustrated in FIG. 14A.

FIGS. 14B and 14C are equivalent circuit diagrams of the compliable network 140 illustrated in FIG. 14A. Referring to FIG. 14B, the MEMS switch 142 in one embodiment may be configured as a voltage-driven switch to turn on the LED 133 in response to light incident on the phototransistor 131.

Referring to FIG. 14C, the MEMS switch 142 in another embodiment may be configured as a current-driven switch to turn on the LED 133 in response to light incident on the phototransistor 131.

Although the present disclosure and its aspects have been described in detail, it should be understood that various changes, substitutions and alterations can be made herein without departing from the spirit and scope of the disclosure as defined by the appended claims. For example, many of the manufacturing or operating processes discussed above can be implemented in different methodologies and replaced by other processes, or a combination thereof.

Moreover, the scope of the present application is not intended to be limited to the particular embodiments of the process, machine, manufacture, composition of matter, means, methods, and/or steps described in the specification. As one of ordinary skill in the art will readily appreciate from the present disclosure, processes, machines, manufacture, compositions of matter, means, methods, and/or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and/or steps.

What is claimed is:

1. A compliable unit comprising:
    a first layer including at least one device component at a first region of the first layer; and
    a second layer including at least one compliable element at a first region of the second layer to transfer the at least one device component to a desired location,
    wherein the first layer and the second layer are arranged in a stack,
    wherein the at least one device component is connected to the at least one compliable element, and
    wherein the second layer is configured to be stretched such that the first layer is laterally expanded from an initial state to an expanded state thereby transferring the at least one device component to the desired location.

2. The compliable unit according to claim 1 further comprising an interposer between the first layer and the second layer.

3. The compliable unit according to claim 1, wherein at least one of the first layer or the second layer includes an interposer.

4. The compliable unit according to claim 1 further comprising at least one device component at a second region of the second layer.

5. The compliable unit according to claim 1 further comprising at least one compliable element at a second region of the first layer.

6. The compliable unit according to claim 1 further comprising a third layer stacked over at least one of the first layer or the second layer.

7. The compliable unit according to claim 6, wherein the third layer includes at least one of one or more device components or one or more compliable elements.

8. The compliable unit according to claim 1, wherein one of the at least one compliable element is connected to one of a power source, ground, and a signal source.

9. The compliable unit according to claim 1, wherein one of the at least one compliable element is configured to perform at least one of transmitting power, carrying signals, serving as an antenna, generating energy, generating signal, or inducing at least one of physical, electromagnetic, optical, or acoustic changes in the surroundings.

10. The compliable unit according to claim 1, wherein the at least one compliable element includes a cap.

11. The compliable unit according to claim 1 further comprising one of an insulator layer and a lubricant layer coated on at least one of the first layer or the second layer.

12. The compliable unit according to claim 1, wherein one of the at least one compliable element is arranged among device nodes and includes a predetermined number of ends connected to the device nodes.

13. The compliable unit according to claim 1, wherein one of the at least one compliable element is arranged under a device node.

14. The compliable unit according to claim 1, wherein one of the at least one compliable element is different in length from another one of the at least one compliable element.

15. A compliable network including a plurality of compliable units, the compliable network comprising:
    a first layer including a plurality of device components at a first region of the first layer; and
    a second layer including a plurality of compliable elements at a first region of the second layer to transfer the device components to a desired location,
    wherein the first layer and the second layer are arranged in a stack,
    wherein each device component is connected to a compliable element, and
    wherein the second layer is configured to be stretched such that the first layer is laterally expanded from an initial state to an expanded state thereby transferring the device components to the desired location.

16. The compliable network according to claim 15 further comprising an interposer between the first layer and the second layer.

17. The compliable network according to claim 15, wherein at least one of the first layer or the second layer includes an interposer.

18. The compliable network according to claim 15 further comprising a plurality of device components at a second region of the second layer.

19. The compliable network according to claim 15 further comprising a plurality of compliable elements at a second region of the first layer.

20. The compliable network according to claim 15 further comprising a third layer stacked over at least one of the first layer or the second layer.

21. The compliable network according to claim 15, wherein the third layer includes at least one of a plurality of device components or a plurality of compliable elements.

22. The compliable network according to claim 15, wherein one of the plurality of compliable elements is connected to one of a power source, ground, and a signal source.

23. The compliable network according to claim 15, wherein one of the plurality of compliable elements is configured to perform at least one of transmitting power, carrying signals, serving as an antenna, generating energy, generating signal, or inducing at least one of physical, electromagnetic, optical, or acoustic changes in the surroundings.

24. The compliable network according to claim 15, wherein at least one of the plurality of compliable elements includes a cap.

25. The compliable network according to claim 15 further comprising one of an insulator layer and a lubricant layer coated on at least one of the first layer or the second layer.

26. The compliable network according to claim 15, wherein one of the plurality of compliable elements is arranged among device nodes and includes a predetermined number of ends connected to the device nodes.

27. The compliable network according to claim 15, wherein one of the plurality of compliable elements is arranged under a device node.

28. The compliable network according to claim 15, wherein one of the plurality of compliable elements is different in length from another one of the plurality of compliable elements.

29. The compliable network according to claim 15, wherein at least one of the compliable units serves as a grabbing pad.

30. The compliable network according to claim 15 further comprising a piezoelectric element attached to one of the first layer and the second layer.

* * * * *